(12) United States Patent
Ophardt et al.

(10) Patent No.: US 9,756,989 B2
(45) Date of Patent: Sep. 12, 2017

(54) SOLAR POWERED DISPENSER SYSTEM

(71) Applicant: OP-Hygiene IP GmbH, Niederbipp (CH)

(72) Inventors: Heiner Ophardt, Arisdorf (CH); Andrew Jones, Smithville (CA)

(73) Assignee: OP-Hygiene IP GmbH, Niederbipp (CH)

(*) Notice: Subject to any disclaimer, the term of this patent is extended or adjusted under 35 U.S.C. 154(b) by 42 days.

(21) Appl. No.: 14/702,086

(22) Filed: May 1, 2015

(65) Prior Publication Data
US 2015/0313422 A1 Nov. 5, 2015

(30) Foreign Application Priority Data

May 1, 2014 (CA) .................................... 2850835

(51) Int. Cl.
| | | |
|---|---|---|
| *B67B 7/00* | (2006.01) | |
| *G01F 11/00* | (2006.01) | |
| *A47K 5/12* | (2006.01) | |
| *B05B 15/04* | (2006.01) | |
| *H01L 31/042* | (2014.01) | |
| *H02J 7/00* | (2006.01) | |
| *H02J 17/00* | (2006.01) | |

(52) U.S. Cl.
CPC .......... *A47K 5/1217* (2013.01); *A47K 5/1211* (2013.01); *B05B 15/0406* (2013.01); *H01L 31/042* (2013.01); *H02J 7/0052* (2013.01); *H02J 17/00* (2013.01)

(58) Field of Classification Search
CPC A47K 5/1217; A47K 5/1211; B05B 15/0406; H01L 31/042; H02J 7/0051; H02J 17/00
USPC .............. 222/1, 184, 192, 185.1; 340/636.2; 320/101; 315/158
See application file for complete search history.

(56) References Cited

U.S. PATENT DOCUMENTS

| | | | | |
|---|---|---|---|---|
| 4,921,150 A | * | 5/1990 | Lagergren | A47K 5/1215 137/624.11 |
| 6,209,752 B1 | * | 4/2001 | Mitchell | A47K 5/1215 222/181.3 |
| 7,247,140 B2 | | 7/2007 | Ophardt | |
| 7,364,053 B2 | | 4/2008 | Ophardt | |
| 8,272,539 B2 | | 9/2012 | Ophardt et al. | |
| 8,696,156 B2 | * | 4/2014 | Yuan | F21V 5/048 362/236 |
| 8,733,596 B2 | * | 5/2014 | Ophardt | A47K 5/1204 222/145.5 |
| 2002/0080603 A1 | * | 6/2002 | Joseph | B82Y 15/00 362/147 |

(Continued)

FOREIGN PATENT DOCUMENTS

| | | |
|---|---|---|
| EP | 2236066 | 10/2010 |
| WO | 2007063480 | 6/2007 |

*Primary Examiner* — J. Casimer Jacyna
*Assistant Examiner* — Benjamin R Shaw
(74) *Attorney, Agent, or Firm* — Thorpe North & Western LLP

(57) ABSTRACT

A system and method for dispensing hand cleaning fluid material including a dispenser with a rechargeable battery powered by a solar generator, a remote electrically powered light source spaced from the dispenser directing light onto the solar panel of the dispenser and a control mechanism controlling the operation of the light source in relation to the status and operation of the dispenser.

15 Claims, 7 Drawing Sheets

(56) References Cited

U.S. PATENT DOCUMENTS

| | | | |
|---|---|---|---|
| 2002/0137374 A1* | 9/2002 | O'Rourke | F21V 23/02 439/121 |
| 2004/0090784 A1* | 5/2004 | Ward | F21V 7/09 362/296.06 |
| 2004/0233676 A1* | 11/2004 | Matts | F16C 11/103 362/418 |
| 2006/0041197 A1* | 2/2006 | Ophardt | G07F 9/02 600/437 |
| 2007/0069868 A1* | 3/2007 | Duplessis | H02J 7/35 315/159 |
| 2008/0265782 A1* | 10/2008 | Crouse | H02J 7/345 315/158 |
| 2009/0109687 A1* | 4/2009 | Householder | F21L 4/027 362/309 |
| 2010/0068899 A1* | 3/2010 | Shvili | F21V 19/006 439/39 |
| 2010/0219206 A1* | 9/2010 | Ophardt | A47K 5/1207 222/192 |
| 2010/0252569 A1* | 10/2010 | Pelfrey | A47K 5/12 222/52 |
| 2011/0218943 A1* | 9/2011 | Haluska | G06Q 99/00 705/500 |
| 2011/0303694 A1* | 12/2011 | Pi | B05B 7/0018 222/41 |
| 2012/0085780 A1* | 4/2012 | Landauer | A47K 5/12 222/52 |
| 2012/0187146 A1* | 7/2012 | Chopra | A61L 2/16 222/52 |
| 2014/0172523 A1* | 6/2014 | Stob | A47K 5/1217 705/14.4 |

\* cited by examiner

SOLAR POWERED DISPENSER SYSTEM

SCOPE OF THE INVENTION

This invention relates to solar powered apparatus and, more particularly, to a system for controlling a solar powered dispenser by control of an electrically powered light source.

BACKGROUND OF THE INVENTION

Dispensers of hand cleaning fluid are known to be placed at locations for easy access by persons as, for example, at locations within a building where persons will pass. For example, in many hospitals, it is desired to provide dispensers of hand cleaners in lobbies and proximate entrances and exits. Hand cleaning dispensers are known which are touchless to minimize cross contamination between persons using the dispensers. Such touchless dispensers typically require electrical energy to sense the presence of a person and to dispense fluid.

Many dispensers which are placed in hospital lobbies and near exitways and passages suffer the disadvantage that they need to be powered by batteries since hardwired electrical supply is not convenient particularly in locations as in the middle of a lobby.

The present inventor has appreciated a disadvantage that battery operated dispensers frequently become inoperative due to the batteries not being changed timely. Moreover, disadvantages of battery operated dispensers include the substantial costs of batteries due to the labor required to replace batteries but also due to the disadvantage that some fluid dispensers may be used more frequently than others resulting in the need for some dispensers to have their batteries replaced frequently and others not so frequently.

SUMMARY OF THE INVENTION

To at least partially overcome these disadvantages of previously known devices, the present invention provides a system and method for dispensing hand cleaning fluid material including a dispenser with a rechargeable battery powered by a solar generator, a remote electrically powered light source spaced from the dispenser directing light onto the solar panel of the dispenser and a control mechanism controlling the operation of the light source in relation to the status and operation of the dispenser. Preferably, the light source is controlled by communication wirelessly between the dispenser and the light source. Preferably, the dispenser is mounted on a floor or a wall and the light source is mounted to a ceiling or a wall above the dispenser.

In one aspect, the present invention provides a preferred system and method for controlled driving of a solar element of a battery operated dispenser with a hardwired light source spaced from the solar element.

In another aspect, the present invention provides a tower structure for advantageous solar powering of at least one or more dispensers removably mounted to the tower.

In another aspect, the present invention provides a novel configuration for a solar powered dispenser in which a solar panel is disposed beneath a drip tray.

In another aspect, the present invention provides a method for providing an electrically powered dispenser of hand cleaning fluid within a building, the method providing:

a solar element commonly mounted with the dispenser supported by the building providing a light source wired to receive power from the building electrical power such that light emitted from the light source is received by the solar element, generating electrical power with the solar element from the light emitted by the light source received by the solar element and providing the electrical power generated by the solar element to the dispenser;

controlling the electrical power generated by the solar element by the control of the operation of the light source by wireless communication from the dispenser to the light source.

In another aspect, the present invention provides a system for controlling electrical power from a solar element to an electrically powered fluid dispenser by the control of a light source spaced remote from the solar element, wherein the light source includes:
a light emitter of light;
a light controller; and
a wireless light communicator;
the light source electrically coupled to an electrical power source;
the light controller controlling the operation of the light emitter by control of the delivery of electrical power to the light emitter;
the solar element and the dispenser are coupled together proximate each other and spaced from the light emitter;
the dispenser comprising:
a reservoir for a fluid to be dispensed,
a pump to dispense the fluid from the dispenser;
a dispenser controller controlling operation of the pump, and
a wireless dispenser communicator;
the solar element and the light emitter relatively juxtapositioned spaced from each other with the light emitted by the emitter directed toward and received by the solar element,
the solar element generates electrical power from the light emitted by the light emitter received by the solar element and provides the electrical power to the dispenser,
the dispenser controller and the light controller together controlling operation of the light emitter in relation to the status or the operation of the dispenser by wireless communication between the dispenser controller and the light controller via the wireless dispenser communicator and the wireless light communicator.

In a further aspect, the present invention provides a method for controlling electrical power from a solar element to an electrically powered fluid dispenser by the control of a light source spaced remote from the solar element, the method comprising:
providing the light source including a light emitter of light, a light controller, and a wireless light communicator;
providing an electrical power source electrically coupled to the light source;
controlling the operation of the light emitter by control of the delivery of electrical power to the light emitter with the light controller;
providing the solar element and the dispenser coupled together proximate each other and spaced from the light emitter;
the dispenser comprising:
a reservoir for a fluid to be dispensed,
a pump to dispense the fluid from the dispenser;
a dispenser controller controlling operation of the pump, and
a wireless dispenser communicator;

providing the solar element and the light emitter relatively juxtapositioned spaced from each other with the light emitted by the emitter directed toward and received by the solar element, generating electrical power with the solar element from the light emitted by the light emitter received by the solar element and providing the electrical power to the dispenser, controlling with the dispenser controller and the light controller the operation of the light emitter in relation to the status or the operation of the dispenser by wireless communication between the dispenser controller and the light controller via the wireless dispenser communicator and the wireless light communicator.

In another aspect, the present invention provides a solar powered fluid dispenser comprising:

a reservoir for a fluid to be dispensed, a pump to dispense the fluid from the dispenser downwardly out of a discharge outlet;

a drip tray located below the outlet, a vertically extending hand space provided between the outlet and the drip tray above the drip tray within which a person's hands may be placed to receive fluid dispensed downwardly from the outlet, the drip tray having an upwardly directed tray catch surface to catch fluid falling downwardly from the outlet or from the person's hand located in the hand space, the tray catch surface permitting light incident thereon to pass through the tray catch surface, a solar element located below the tray catch surface to receive the light passing through the tray catch surface and generate electrical power.

BRIEF DESCRIPTION OF THE DRAWINGS

Further aspects and advantages of the present invention will become apparent from the following description taken together with the accompanying drawings in which.

DETAILED DESCRIPTION OF THE DRAWINGS

Figure 1:
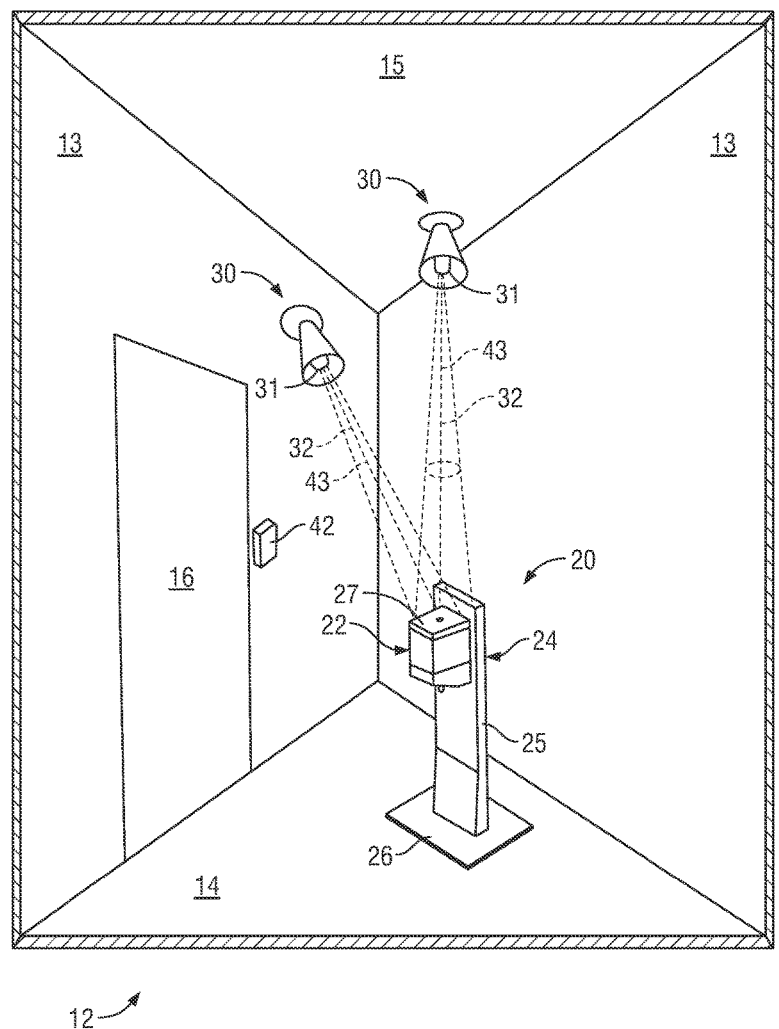
FIG. 1 is a schematic pictorial view of a dispensing system in accordance with a first aspect of the present invention.
Figure 2:
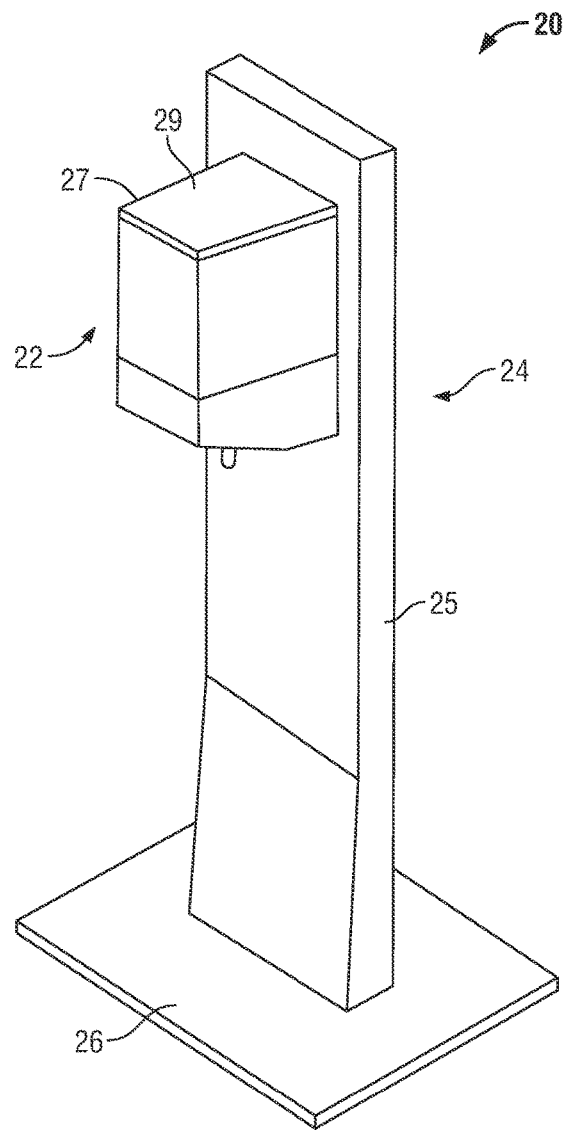
FIG. 2 is an enlarged pictorial view of a solar powered dispenser on a tower stand as shown in FIG. 1.

Reference is made to FIG. 1 which illustrates a dispensing system 10 in accordance with the first embodiment of the present invention. FIG. 1 schematically illustrates a portion of a building 12 partially cut away to show a pair of walls 13 spanning between a floor 14 and a ceiling 15. An access door 16 is shown through one of the walls 13. A dispenser assembly 20 is shown to be a free-standing stand or tower assembly 24 supported on the floor 14. The dispenser assembly 20 includes a dispenser 22 of hand cleaning fluid mounted to the tower assembly 24 including a tower 25 and a floor engaging base 26. The tower 25 extends upwardly from the base 26 and is supported by the base 26. The dispenser assembly 20 preferably is free-standing and may be moved to different locations on the floor 14 as may be desired to locate the dispenser 22 at desired locations for use about the building. The dispensing system 10 includes two separate lamps or light sources 30 shown, one of which is mounted to the ceiling 15 and another of which is mounted to one of the walls 13, however, only one of the light sources 30 are necessary. The dispenser 22 carries on an upwardly directed surface thereof a solar element or solar panel 27. Each light source 30 includes a light emitter 31 which directs light 32 outwardly therefrom such that at least a portion of the light 32 falls on and is incident on the solar panel 27 whereby the solar panel 27 generates electricity to power the dispenser 22.

Figure 3:
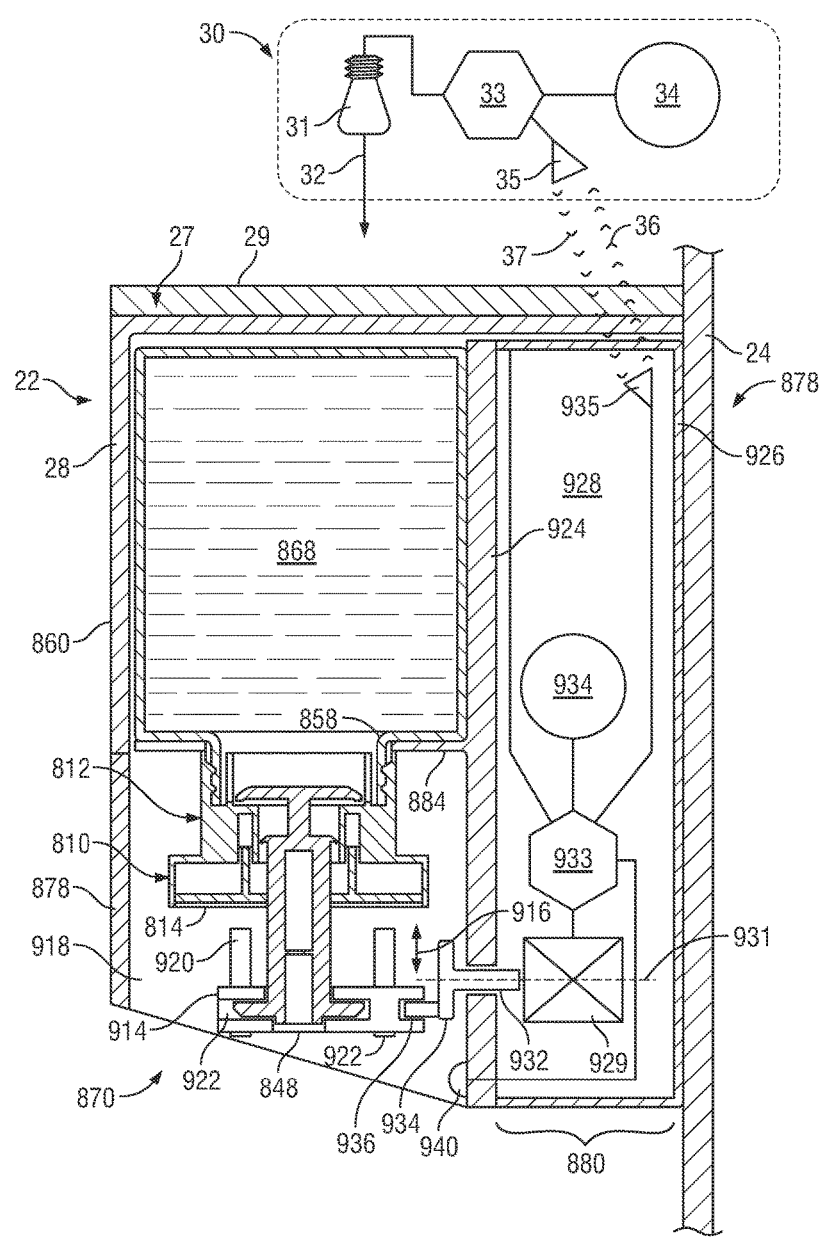
FIG. 3 is a schematic representation of the dispensing system of FIG. 1 with the solar powered dispenser shown schematically in side view.

Reference is made to FIG. 3 which shows a schematic control diagram for the dispenser assembly 20 having one light source 30 and the dispenser 22. FIG. 3 also shows a schematic cross-sectional side view of the dispenser 22. The dispenser 22, shown in FIG. 3, has many similarities to the dispenser shown in FIG. 26 of U.S. Patent Publication US 2013/0119093, published May 16, 2013 to Ophardt et al, the disclosure of which is incorporated herein by reference. Other dispensers can be used. The dispenser 22 includes a fluid containing reservoir 860 and a pump assembly 810. The pump assembly 810 is secured in a neck 858 of the reservoir. The pump assembly 810 includes a piston-forming element or piston 814 which is axially reciprocally slidable within a piston chamber-forming body or body 812 so as in a known manner to draw fluid such as liquid soap 868 from the reservoir 860 and dispense the liquid mixed with air out an outlet 848 at the lower outer end of the piston 814. The pump assembly 810 shown has a configuration similar to that disclosed in U.S. Patent Publication US 2009/0145296 to Ophardt et al, published Jun. 11, 2009, the disclosure of which is incorporated herein by reference. The pump assembly 810 illustrated is adapted for simultaneous discharge of the liquid from the reservoir together with air to provide a foam. Other piston pumps may be utilized as, for example, merely to dispense liquid. Other pump assemblies can be used without any limitation to the pump being a piston pump.

The dispenser 22 has a housing generally indicated 878 to receive and support the pump assembly 810 and the reservoir 860. The housing 878 is shown with a backplate assembly 880 with a rear plate 926 for mounting the housing to the tower 24. A support plate 884 extends forwardly from the backplate assembly 880 to support and receive the reservoir 860 and the pump assembly 810. An actuator slide plate 914 is slidably mounted to the housing 878 for limited vertical movement in the direction indicated by the arrow 916. Housing 878 has two side plates 918, one on each side, to extend downwardly from the support plate 884. The actuator slide plate 914 extends laterally between the side plates 918 of the dispenser and be engaged within vertical slide grooves 920 and 922 to guide the actuator slide plate 914 in vertical sliding. The actuator slide plate 914 has a forward opening cavity 922 formed therein such that the piston 814 may be slid rearwardly into the cavity 922 so as to receive an engagement flange on the piston 814 within the cavity 922 and couple the piston 814 to the actuator slide plate 914 such that vertical sliding of the actuator slide plate 914 slides the piston 814 coaxially within the body 812.

The backplate assembly 880 includes an interior plate 924 and the rear plate 926 forming a rear cavity 928 therebetween. A motor 929 is schematically shown as provided in the cavity 928 which rotates about an axis 931, an output shaft 932 carrying a rotating wheel 934 coaxial with the shaft 932. A crank pin 936 is mounted at one circumferential location on the wheel. The crank pin 936 is received in a slot in the actuator slide plate 914. With rotation of the shaft 932 and wheel 934, engagement between the crank pin 936 and the actuator slide plate 914 will cause the actuator slide plate to slide vertically upwardly and downwardly in a reciprocal manner thus moving the piston 814 relative to the body 812 to discharge air and liquid as foam out the outlet 848.

Within the cavity 928, there is schematically shown not only the motor 929 but also a dispenser controller 933 and a rechargeable power source or battery 934. A sensing device 940 is provided on the plate 924 as, for example, to sense the presence of a user's hand underneath the discharge outlet 848 of the pump assembly 810 as controlled by the dispenser controller 933 to which the sensing device 940 is connected. A dispenser communicator 935 is shown in the cavity 928 connected to the dispenser controller 933. The dispenser communicator 935 provides for wireless communication as by a preferred Wi-Fi communication, however, any manner of wireless communication may be used including, for example, Bluetooth, infrared, ultrasonic and the like, without limitation.

In FIG. 3, the light source 30 is schematically shown to include a light emitter 31 which emits light 32, a light controller 33, a power source 34 and a light communicator 35. The power source 34 preferably provides power from the building utilities which preferably is AC or DC electrical power from a substantially constant reliable electrical source. The light controller 33 controls operation of the light emitter 31. The dispenser communicator 935 of the dispenser 22 and the light communicator 35 of the light source 30 are adapted to communicate with each other, which communication may be one-way or two-way. For one-way communication from the dispenser controller 933 to the light controller 33, the dispenser communicator 935 would include a wireless transmitter and the light communicator 35 would include a wireless receiver. For two-way communication, each would include a receiver and transmitter.

The dispenser 22 includes a removable cover 28 which is removably secured to the housing 878. The solar element or solar panel 27 is shown as mounted to the cover 28 and electrically coupled to the dispenser controller 933 and battery 934. The solar panel 27 has an upwardly directed surface 29 upon which at least some of the light 32 from the light emitter 31 impinges. In a known manner, the solar panel 27 on receiving the light 32 generates electrical energy from the light incident on the solar panel 27 and provides this electrical energy to the rechargeable battery 934 as controlled by the dispenser controller 933.

The dispenser controller 933 and the light controller 33 control the operation of the light emitter 31 in relation to the status and/or operation of the dispenser 22 by wireless communication between the dispenser controller 933 and the light controller 33 via the wireless dispenser communicator 935 and the wireless light communicator 35 of the light source 30. In one preferred manner of control, the dispenser controller 933 monitors the extent to which the dispenser battery 934 is charged or uncharged. If the battery 934 is determined by the dispenser controller 933 to be less than what is considered to be fully charged, then the dispenser controller 933 using the wireless communicator 935 sends signals to the wireless communicator 35 of the light source 30 such that when the signals are received by the light controller 33, the light controller 33 will provide power from the power source 35 to turn on the light emitter 31 to generate and direct light 32 onto the solar panel 27 which generates electrical energy to recharge the dispenser battery 934. If the battery 934 is determined by the dispenser controller 933 to be fully charged, then the dispenser controller 933 provides for signals to be sent to the light controller 33 via the dispenser communicator 935 such that when the signals are received by the light controller 33, the light controller 33 will stop power from the power source to turn off the light emitter.

The wireless communication between the wireless dispenser communicator 935 and the wireless light communicator 35 may be one-way from the dispenser controller 933 as indicated by the curved lines 36 from the wireless communicator 935 to the wireless communicator 35 or may be two-way also including wireless communication as indicated by the wave lines 37 from the wireless communicator 35 to the wireless communicator 935. The light controller 33 thus controls the operation of the light emitter 31 as to the intensity of light 32 emitted by the light emitter 31 as driven by electrical power from the electrical power source 34. The intensity of the light 32 may be varied between off and on conditions of the light emitter 31 and when in an on condition may be varied over a range of light intensities and/or light frequencies or wavelengths. For example, under conditions that the dispenser controller 933 may desire to promptly recharge the battery 934, the light emitter 31 may be desired to provide light 32 at its highest intensity towards having the solar panel 27 generate as much electricity as possible over time to promptly charge the battery 934. On the other hand, driving the light emitter 31 at its highest intensity may provide undue ambient light within an area within building 12 about the dispenser assembly 20 and it may be desired to control the operation of the light emitter 31 so as to provide a lower intensity light which, while taking a longer time to recharge the battery 934 with the solar panel 27, will still be adequate to maintain the battery 934 at levels for operation of the dispenser 22.

The dispenser controller 933 may having regard to various inputs: such as time including time of day and the day, historical data on usage of the dispenser 22 with time and the like; towards deciding whether the dispenser controller 933 may desire the light emitter 31 to be powered up to emit light 32 and the intensity or frequency of such light 32.

The light controller 33 may comprise a relatively simple control mechanism possibly merely providing an on/off switch which is switched on receipt of a signal from the dispenser controller 933 with the dispenser controller 933 thus performing substantially all the computing functions determining operation of the dispenser 22 and the light source 30. Alternatively, the dispenser controller 933 may transmit relevant data regarding the dispenser 22 to the light controller 33 and the light controller 33 may carry out more substantial computing functions and carry out the more substantial computing tasks of the two controllers in determining when the light emitter 31 may be powered to discharge light 32. In any event, one or both of the dispenser controller 933 and the light controller 33 will control operation of the light emitter 31 in relation to the status or operation of the dispenser 22.

Preferably, one or both of the dispenser controller 933 and the light controller 33 may communicate with other external remote devices such as, for example, wirelessly to a router and hence to the Internet and/or a computer or to one or more external or central computers which may monitor and further control of the operation of the light emitter 31 and/or soap dispenser 22. As but one example, the dispenser controller 933 may monitor the usage of the dispenser and provide signals to a remote central computer indicative of whether the reservoir 860 may be empty or substantially empty of fluid and whether the reservoir needs to be replaced. Similarly, the dispenser controller 933 may communicate with a central computer to provide information about use of the dispenser 22, its status and various compliance data regarding handwashing compliance by persons. The light controller 33 may also communicate with a central computer regarding information relevant to the use and lifetime of the light emitter 31.

The wireless communication between the dispenser 22 and the light source 30 may be by wireless communication with the dispenser communicator 935 with a remote element (not shown) different than the light controller 33 with the remote element then relaying the signals to the light controller 33. For example, the dispenser communicator 935 may communicate wirelessly to a router connected to a remote central computer which will then communicate with the light communicator 35, preferably wirelessly, but also possibly by wired communication. The remote control computer could substantially control both operating the dispenser 22 and the light source 30 albeit through the dispenser controller 933 and the light controller 35.

The light emitter 31 can be selected to emit light of desired frequencies or wavelengths and at desired relative intensities of light at different frequencies or wavelengths. The light 32 emitted may preferably be controlled as to both a wavelength spectrum of light emitted and intensity of wavelength as, for example, to optimize energy generated by the solar element 27 from energy input to the light source 30 or to control the visible light emitted by the light emitter 31 within the area about the dispenser 22. For example, emitting light of frequencies not visible to humans may be advantageous to reduce visible light about the dispenser 22 while permitting generating of power by the solar panel 27.

For but one-way communication from the dispenser 22 to the light source 30, the wireless dispenser communicator 935 would merely need to include a wireless dispenser transmitter and the wireless light communicator could be merely a wireless receiver. Insofar as the dispenser wireless communicator 935 is to provide two-way communication, it includes both a wireless dispenser transmitter and a wireless dispenser receiver. Similarly, insofar as the wireless light communicator 35 is to provide for two-way wireless communication, it includes both a wireless transmitter and a wireless receiver.

In the dispenser 22, the rechargeable power source is indicated as being a rechargeable battery 934. However, other rechargeable power sources may be utilized including, for example, a capacitor as a rechargeable power source.

In accordance with a preferred arrangement, the dispenser controller 933 monitors the status of the rechargeable power source 934 and the operation of the light emitter 31 is controlled to maintain the status of the rechargeable power source within certain ranges of being fully recharged.

The solar panel 27 is preferably a solar element which generates electrical energy from light incident thereon within a range of frequencies or wavelengths and, preferably, the light emitter 31 emits the light 32 to be received by the solar element 27 within the range of frequencies or wavelengths of the solar panel 27.

The solar panel 27 also sometimes referred to as a solar element, is preferably adapted to be removably coupled to the dispenser 22 as, for example, being either coupled to the removable cover 28 or removably coupled to the cover 28. Preferably, the solar panel 27 is electrically coupled to the dispenser 22 for easy removal as by the use of a connection wiring plug adapted to be removably received in a socket coupled to the dispenser controller 933 and/or battery 934. In this manner, the solar panel 27 can easily be removed from the dispenser and replaced by another solar panel.

Referring to FIG. 1, the dispenser 22 is shown mounted within a building 12 and the two light sources 30 are mounted spaced from the dispenser 22 to the ceiling 15 of the building 12 or to a wall 13 of the building 12. Each of the light sources 30 are preferably as shown mounted to the building 12 at a height above the dispenser 22 with the light emitter 31 to direct light 32 downwardly onto the solar panel 27 of the dispenser. As seen in FIG. 1, the dispenser 22 is mounted on the tower assembly 24 providing a free-standing stand which is supported by the floor 14 of the building 12 at a location remote from the walls 13 of the building and can be manually moved to different locations. Preferably, the light source 30 is merely or solely the light source 30 that is mounted to the ceiling 15 of the building 12 above the dispenser 22. However, either mounting of the light sources 30 to a wall 13 or to the ceiling 15 is advantageous. Advantageous mounting of each light source 30 is at a height above a height at which a light source 30 is accessible by a person standing on the floor.

As seen in FIG. 1, an element or box 42 is mounted to one wall 13, as shown but not necessary, adjacent the access door 16 at a height accessible to a person standing on the floor. This box 42 may serve a number of different functions. In one arrangement, the box 42 comprises an input mechanism for the light source 30 which input mechanism can be hardwired to the light controller 33. The input mechanism may provide manual controls by which input may be provided as by a person to the light controller 33 and/or through the light controller 33 to the dispenser controller 22. The input mechanism may provide for a manual power on or power off to the light source 30 as in the manner of a light switch, with or without intensity control.

The wall mounted box 42 may carry components of the light source 30 as, for example, it may carry one or more of the light controller 33 and the light communicator 35.

As can be best seen in FIG. 1, the light emitter 31 directs a beam of light 32 towards the solar element 27. Preferably, the light emitter 31 directs light away from the light emitter 31 towards the solar element 27 within a cone about an axis 43 extending away from the light emitter 31. The cone is preferably defined within a divergence angle circumferentially about the axis 43. A radius of the cone increases with distance from the light emitter 31. In one preferred embodiment in the divergence angle of the cone is less than 10 degrees, more preferably, less than 3 degrees. As schematically illustrated in FIG. 1, the light source 30 may include a mount 44 by which the light emitter 31 is mounted to the wall 13 or ceiling 15 with the light emitter 31 movable to relative positions relative to the mount 44 to position the light emitter 31 to direct the emitted light 32 towards the solar element 27. The dispenser controller 933 can be configured to monitor the power generated by the solar element 27 and provide feedback to assist in moving the light emitter 31 to one of the relative positions relative the mount 44 to position the light emitter 31 to direct a maximum amount of light energy on the solar panel 27.

The light source 30 and its mount 44 may include a mechanical mechanism with motors (not shown) to move the light emitter 31 to different relative positions which motors can be driven by signals transferred from the dispenser controller 933 to the light controller 33 regarding the intensity of light received by the solar panel 27 and/or the amount of electrical power generated by the solar panel 27.

Figure 4:
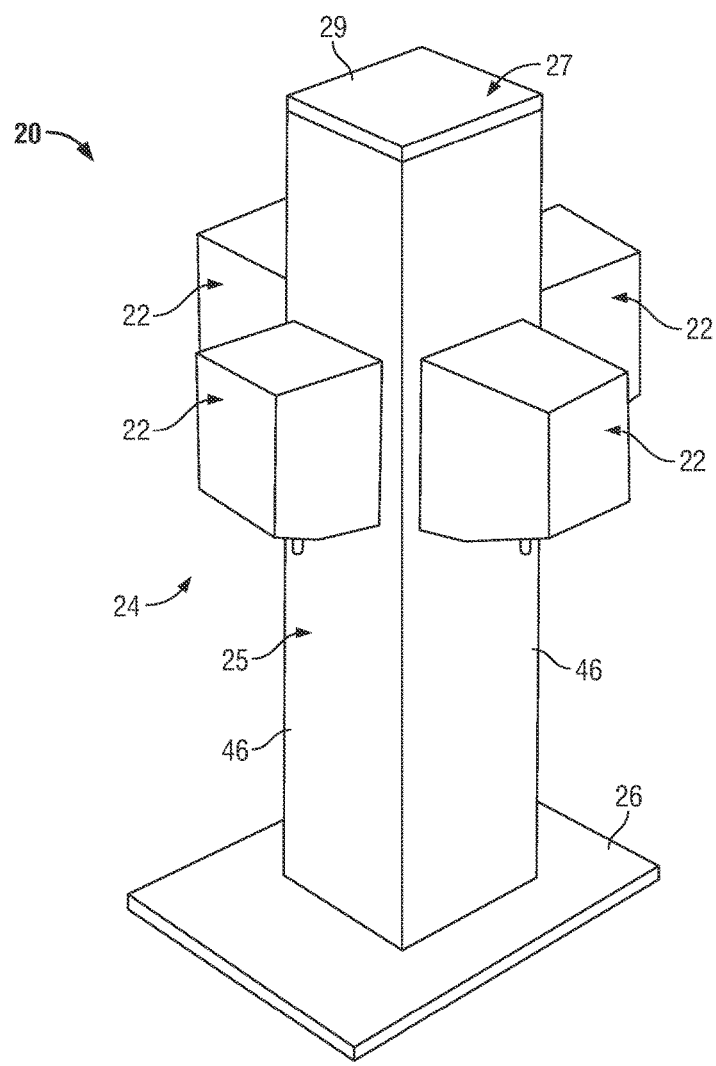
FIG. 4 is a pictorial view of a dispenser tower stand in accordance with a second embodiment of the present invention.
Figure 5:
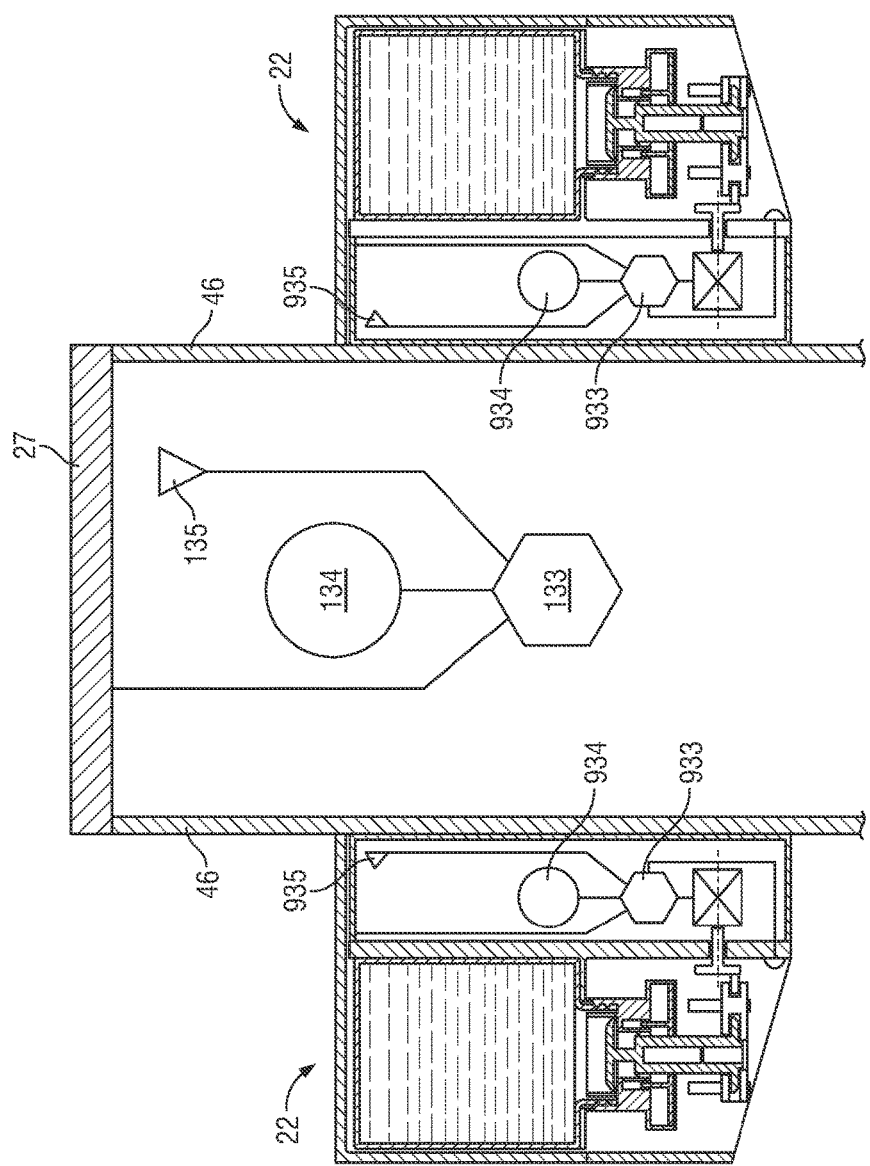
FIG. 5 is a schematic partial cross-sectional view through the stand of FIG. 4.

Reference is made to FIGS. 4 and 5 which illustrate a second embodiment of a dispenser assembly 20 useful in substitution for the dispenser assembly 20 shown in FIG. 1. Throughout all the drawings, similar reference numerals are used to refer to similar elements.

In FIGS. 4 and 5, the dispenser assembly 20 also includes a tower assembly 24. The tower assembly 24 includes a floor engaging base 26 and a tower 25. The tower 25 extends upwardly from the base 26 and is supported by the base 26. The tower 25 is shown to be rectangular in horizontal cross-section and as having four side walls 46. Four dispensers 22 are shown, each mounted to one of the side walls 46. At the upper end of the tower 25 at the upper end of each of the side walls 46, the solar panel 27 is provided with its upwardly directed surface 29.

FIG. 5 shows a schematic cross-sectional view through a portion of the dispenser assembly 20 of FIG. 4. Each of the dispensers 22 are shown to be identical to the dispenser 22 as illustrated in cross-section in FIG. 3, however, each dispenser 22 in FIG. 5 does not carry a solar panel 27 on top of the cover 28 as shown in FIG. 3. Rather, a single solar panel 27 is provided at the top of the tower 25.

Internally within the tower 25, there is provided a tower controller 133, a rechargeable tower battery 134 and a wireless tower communicator 135. The tower controller 133 is connected to each of the solar panel 27, the rechargeable tower battery 134, the tower communicator 135 and, as well, to the dispenser controller 933 of each of the dispensers 22. Each of the dispensers 22 is shown as including a rechargeable battery 934. Preferably, the tower assembly 24 has its own rechargeable tower battery 134 and each of the dispensers 22 will have its own dispenser battery 934 which is preferably rechargeable. However, the rechargeable tower battery 134 could be eliminated such that there are merely rechargeable batteries 934 in each dispenser 22. Alternatively, the dispenser batteries 934 may be eliminated and merely the rechargeable tower battery 134 be provided.

The tower assembly 24 is shown as including a wireless tower communicator 135 as for communication with the light communicator 35 of the light source 30. In FIG. 5, the tower assembly 24 includes the tower communicator 135 and each of the dispensers 22 is shown as including dispenser communicator 935. Either the tower communicator 135 could be eliminated or each dispenser communicator 935 could be eliminated, however, providing for communication capability in both the tower assembly 24 and each dispenser 22 can provide for communication, for example, from each dispenser 22 to the light source 30 or from each dispenser 22 to other remote devices as, for example, to transfer information to a remote central computer which information may include information other than information relating to operation of the light source 30.

Preferably, each of the dispensers 22 is removably mounted to its respective wall of the tower 25 and the electrical connection of the electrical circuitry within each dispenser 22 is adapted for easy connection and disconnection with the electrical circuitry within the tower assembly 24 as by a simple snap-fit male and female connection or by a jack to be removably received in a socket.

Figure 6:
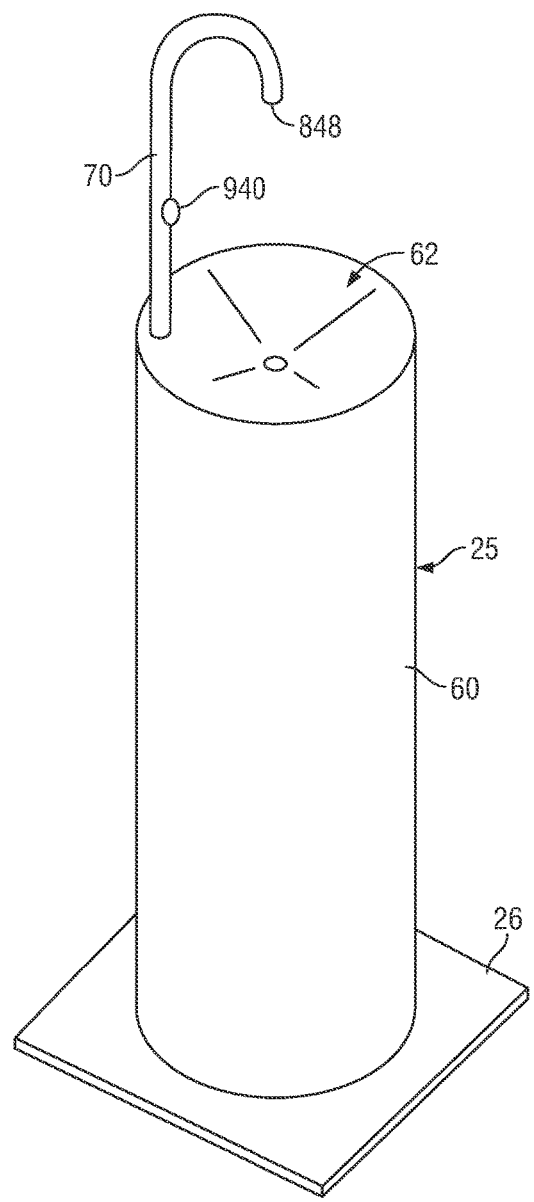
FIG. 6 is a schematic pictorial view of a solar dispenser stand in accordance with a third embodiment of the present invention.
Figure 7:
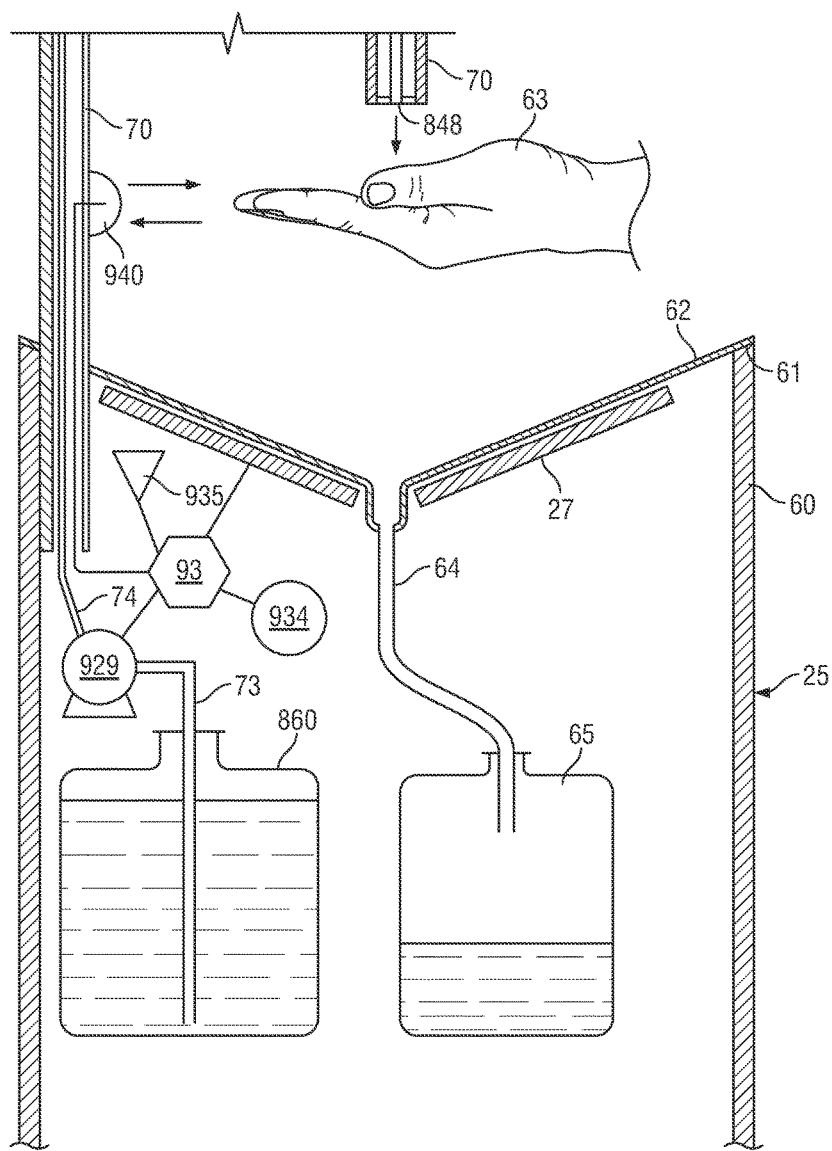
FIG. 7 is a schematic partial cross-sectional view through the stand of FIG. 6.

Reference is made to FIGS. 6 and 7 which illustrate a third embodiment of a dispenser assembly 20 suitable for substitution for the dispenser assembly 20 in FIG. 1. The dispenser assembly 20 includes a tower assembly 24 with a tower 25 supported on the floor via a base 26. The tower 25 is shown as comprising a cylindrical tube 60. Supported at the upper end 61 of the tube 60 is a frusto-conical drip tray 62 adapted to capture any over spray of fluid which may be dispensed from the dispenser 22 or may drip downwardly off a user's hand 63. The drip tray 62 directs the over spray via a tube 64 into a bottle 65. The drip tray 62 is formed of a thin sheet of material which permits the light to pass therethrough. A solar panel 27 is supported within the tower 25 below the drip tray 62 such that light passing through the drip tray 62 is incident on the solar panel 27 to create electrical power.

A hand cleaner fluid dispensing spout 70 is mounted to the tower 25 and extends upwardly then curves downwardly to present a downwardly directed discharge outlet 848. A reservoir bottle 860 of hand cleaning fluid is provided inside the tower 25 and an electrically powered liquid pump 929 draws fluid from the bottle 860 via an inlet tube 73 and discharges fluid to the discharge outlet 848 via an outlet tube 74. The tower 25 carries a dispenser controller 933, a dispenser rechargeable battery 934, a dispenser communicator 935 and a sensor 940 to sense the presence of a user's hand 63 underneath the discharge outlet 848. The manner of operation of the dispenser to dispense liquid from the discharge outlet 848 can be similar to that taught in U.S. Pat. No. 7,364,053 to Ophardt, issued Apr. 29, 2008, the disclosure of which is incorporated herein by reference, albeit, with the dispenser controller 933 and liquid pump 929 adapted to be driven by electrical power from the rechargeable battery 934. A second pump (not shown) could be provided as an air pump to simultaneously discharge air with the liquid from the outlet as foam. The embodiment of FIG. 6 shows but a single spout 70 with a single discharge outlet 848. A plurality of similar spouts 70 could be provided about a single tower with common or separate drip trays and solar panels provided conveniently below the drip trays out of sight.

The drip tray 62 needs to permit the transfer therethrough of light of a frequency or wavelength to be received by the solar panel 27 and be useful to generate electricity. The drip tray 62 preferably is transparent but may be translucent and permit merely the transfer of light incident thereon of a frequency or wavelength useful by the solar panel 27 to generate electricity.

In each of the three embodiments, the electrical circuitry for the various components has been schematically shown with, for example, each electrical component connected to a respective controller. It is to be appreciated that this is a simplistic view and, for example, any solar panel 27 might be connected directly to a respective battery.

In each of the embodiments, it is preferred if there may be some mechanism for determining the extent to which a rechargeable battery may be fully charged and preferably a mechanism for determining the quantity of energy that is being transferred to a battery at any time. Such mechanisms are known to persons skilled in the art and could be readily incorporated into the dispenser controller 933 or tower controller 133. Measuring the quantity of electricity being produced by the solar panel 27 over short periods of time can also provide a measure by which the light emitter 31 can be orientated towards optimizing the light received by the solar element 27.

In each of the embodiments illustrated, the dispenser assembly 20 is illustrated as being carried on a free-standing stand or tower 25 supported on the floor 14. The dispenser assembly could alternatively comprise but a dispenser 22 with a solar panel 27 carried thereon with the dispenser 22 mounted to a wall without the need for a tower 25.

As to the nature of the light source, in many building environments, an array of light emitters 31 are provided in a ceiling. It is possible that one of these light emitters may be independently controlled via the light controller 33 separate from the other light emitters in the array. In one convenient method in accordance with the present invention, the dispensing assembly 22 is physically located to be at a position on a floor or on a wall directly vertically below a light emitter 31 which is to provide light to the solar panel 27. Thus, in accordance with the present invention, a method is provided for dispensing hand cleaning fluid involving locating a solar powered dispenser comprising a dispenser 22 carrying a solar panel 27 at a location within a building 12 below an existing light source 30 and then controlling the operation of the light source 30.

In many buildings where light sources are provided in the ceiling as an array of light sources, those light sources which are to be used to provide light incident on the dispenser assembly 20 may be modified so as to have different light emitters than the light emitters of the other light sources in the array. For example, the light emitter of the light source which is to provide most directly light to the solar panel of the dispenser assembly may have a light emitter selected, for example, to comprise a relatively high intensity lamp with a relatively narrow angle of divergence.

The particular nature of the light emitter which may be selected for any particular light source is not limited. Energy efficient lamps are preferred. The use of a laser light to focus a beam of light on the solar element may also be advantageous ensuring that the laser does not direct a beam which would be harmful or hazardous to persons.

The light source 30 preferably directs light onto the solar element. The light emitter may have various focusing arrangements such as reflective lens towards directing a beam of light substantially parallel as a focus beam onto the solar element.

In each of the embodiments, the solar panel 27 is shown at an orientation fixed to the dispenser apparatus 20, however, this is not necessary and the solar panel 27 may be adapted to be mounted for movement to assume positions in which it advantageously receives light from the light source.

As used in this disclosure, the terms "solar panel" and "solar element" are defined as meaning any panel, cell, photovoltaic device that is capable of converting light energy, also referred to as a solar energy, into electrical power. The solar element or solar panel is selected to be of a type which is efficient in converting to electrical energy the nature of the light from the light source.

The rechargeable power source provided in the dispensers may comprise a non-memory type battery such as a nickel-metal-hydride battery or a lithium ion battery, however, any type of rechargeable battery may be useful. The rechargeable battery storage component may comprise at least one storage capacitor.

In the first embodiment, the dispenser 22 includes a rechargeable power source, the rechargeable battery 934. The battery 934 may be eliminated and the dispenser 22 powered merely by electrical energy supplied directly from the solar panel 27 without the need for any battery on the dispenser 22. Alternatively, the battery 934 may be provided as a relatively small electrical capacity battery which may or may not be rechargeable and power required to drive the dispensing pump 810 may be provided by the solar panel 27 and not the battery.

In the third embodiment, the drip tray 62 is shown as frustoconical. The drip tray may have many other configurations and shapes. For example, the drip tray may be shaped like a sink or basin. The drip tray 62 may be flat and angled to one side, possibly with slightly upraised sides. The drip tray 62 is shown as directing fluid to an outlet tube 64 and to a bottle 65. Neither are necessary and the drip tray 62 may itself form a reservoir for fluid collected. The drip tray 62 may merely comprise a surface on which dripping fluid is caught to be held or possibly for alcohol based fluids, until the fluid evaporates.

While the invention has been described with reference to preferred embodiments, many modifications and variations will now occur to a person skilled in the art. For a definition of the invention, reference is made to the following claims.

We claim:

1. A method for providing for an electrically powered dispenser of hand cleaning fluid within a building, the method comprising:

providing a solar element commonly mounted with the dispenser supported by the building, providing a light source wired to receive power from a building electrical power source such that light emitted from the light source is received by the solar element, generating electrical power with the solar element from the light emitted by the light source received by the solar element and providing the electrical power generated by the solar element to the dispenser;

controlling the electrical power generated by the solar element by the control of the operation of the light source by wireless communication from the dispenser to the light source, the light source includes a light emitter of light, a light controller, and a wireless light communicator, controlling the operation of the light emitter with the light controller by control of the delivery of electrical power from the building electrical power source to the light emitter, the solar element and the dispenser are coupled together proximate each other and spaced from the light emitter;

the dispenser comprising:

a reservoir for a fluid to be dispensed, a pump to dispense the fluid from the dispenser; a dispenser controller, and a wireless dispenser communicator;

controlling operation of the pump with the dispenser controller;

locating the solar element and the light emitter relatively juxtapositioned spaced from each other with the light emitted by the emitter directed toward and received by the solar element, generating electrical power with the solar element from the light emitted by the light emitter received by the solar element and providing the electrical power generated to the dispenser, controlling operation of the light emitter with the dispenser controller and the light controller together controlling operation of the light emitter in relation to the status or the operation of the dispenser by wireless communication between the dispenser controller and the light controller via the wireless dispenser communicator and the wireless light communicator, the light emitter includes a mount by which the light emitter is mounted to the building, moving the light emitter to relative positions relative the mount to position the light emitter to direct the emitted light toward the solar element, monitoring with the dispenser controller the power generated by the solar element and providing feedback to assist in moving the light emitter to one of the relative positions relative the mount to position the light emitter to direct a maximum amount of light energy on the solar element.

2. A method as claimed in claim 1 wherein:
the dispenser is not wired to an AC or DC building electrical source, and
the dispenser is mounted to a ceiling or to a wall of the of the building at a height below the light source.

3. A method as claimed in claim 1 wherein the dispenser is a touchless dispenser which includes a hand sensor to sense the presence of a person's hand proximate an outlet for the pump,
operating the pump to dispense fluid onto the person's hand when the dispenser controller determines with the sensor the presence of a person's hand under the outlet.

4. A method as claimed in claim 3 wherein the dispenser further includes a rechargeable power source, wherein said power generated by the one solar element charges the rechargeable power source,
monitoring with the dispenser controller the status of the rechargeable power source and controlling the operation of the emitter to maintain the status of the rechargeable power source within a certain range of being fully recharged.

5. A method as claimed in claim 1 wherein controlling the operation of the light emitter having regard to information selected from information regarding the status or the operation of the dispenser; information regarding the status and operation of the light emitter, and information regarding time.

6. A method as claimed in claim 1 wherein the dispenser further includes a rechargeable power source, wherein said power generated by the one solar element charges the rechargeable power source,
monitoring with the dispenser controller the status of the rechargeable power source and controlling the operation of the emitter to maintain the status of the rechargeable power source within a certain range of being fully recharged.

7. A method as claimed in claim 1 wherein the dispenser is mounted on a stand supported by a floor of the building remote from walls of the building, and the light source is mounted to a ceiling of the building above the dispenser.

8. A method as claimed in claim 1 including:
directing with the light emitter a beam of light through atmospheric air away from the light emitter toward the solar element within a cone about an axis passing through the light emitter,
the cone defined within a divergence angle circumferentially about the axis, and a radius of the cone increasing with distance from the light emitter toward the solar element, and the divergence angle is less than 10 degrees.

9. A method as claimed in claim 1 including:
dispensing with the pump the fluid from the dispenser downwardly out of a discharge outlet;
providing a drip tray with an upwardly directed tray catch surface located below the outlet,
providing a vertically extending hand space between the outlet and the drip tray above the drip tray within which a person's hands may be placed to receive fluid dispensed downwardly from the outlet,
catching fluid falling downwardly from the outlet or from the person's hand located in the hand space in the drip tray,
the tray catch surface permitting light incident thereon to pass through the tray catch surface, and
passing the light through the tray catch surface to the solar element below the tray catch surface.

10. A method as claimed in claim 1 wherein the light source is mounted to a ceiling of the building above the dispenser.

11. A method for providing an electrically powered dispenser of hand cleaning fluid within a building,
the method comprising:
providing a solar element commonly mounted with the dispenser supported by the building,
providing a light source wired to receive power from a building electrical power source such that light emitted from the light source is received by the solar element,
generating electrical power with the solar element from the light emitted by the light source received by the solar element and providing the electrical power generated by the solar element to the dispenser;
controlling the electrical power generated by the solar element by the control of the operation of the light source by wireless communication from the dispenser to the light source the light source includes a light emitter of light, a light controller, and a wireless light communicator;
controlling the operation of the light emitter with the light controller by control of the delivery of electrical power from the building power source to the light emitter;
the solar element and the dispenser are coupled together proximate each other and spaced from the light emitter;
the dispenser comprising:
a reservoir for a fluid to be dispensed, a pump to dispense the fluid from the dispenser; a dispenser controller, and a wireless dispenser communicator;
controlling operation of the pump with the dispenser controller;
locating the solar element and the light emitter relatively juxtapositioned spaced from each other with the light emitted by the emitter directed toward and received by the solar element,
generating electrical power with the solar element from the light emitted by the light emitter received by the solar element and providing the electrical power generated to the dispenser,
controlling operation of the light emitter with the dispenser controller and the light controller together controlling operation of the light emitter in relation to the status or the operation of the dispenser by wireless communication between the dispenser controller and the light controller via the wireless dispenser communicator and the wireless light communicator,
a freestanding support stand with a base for engaging the floor of the building,
the stand extending upwardly from the base,
the solar element is mounted to the support stand,
the dispenser comprising a plurality of said dispensers, each mounted to the support stand with the dispenser controller of each dispenser electrically coupled to the solar element mounted to the support stand.

12. A method as claimed in claim 11 wherein:
the solar element comprises a common element mounted to the support stand,
the dispenser controller is a common controller mounted to the support stand, and
the dispenser controller of each dispenser comprising at least in part the common controller.

13. A method as claimed in claim 12 further comprising a rechargeable common power source mounted to the support stand and coupled to said common controller,
generating said power by said common element charger and delivering it to said rechargeable power source, and each dispenser controller is electrically coupled to the common power source.

14. A method as claimed in claim 11 in which the light emitter includes a mount by which the light emitter is mounted to the building, moving the light emitter to relative positions relative the mount to position the light emitter to direct the emitted light toward the solar element.

15. A method as claimed in claim 14 including monitoring with the dispenser controller the power generated by the solar element and providing feedback to assist in moving the light emitter to one of the relative positions relative the mount to position the light emitter to direct a maximum amount of light energy on the solar element.

* * * * *